(12) United States Patent
Jia

(10) Patent No.: US 12,156,433 B2
(45) Date of Patent: Nov. 26, 2024

(54) DISPLAY SUBSTRATE AND MANUFACTURING METHOD THEREOF, DISPLAY DEVICE, AND INKJET PRINTING METHOD

(71) Applicants: Hefei BOE Joint Technology Co.,Ltd., Anhui (CN); BOE Technology Group Co., Ltd., Beijing (CN)

(72) Inventor: Wenbin Jia, Beijing (CN)

(73) Assignees: Hefei BOE Joint Technology Co., Ltd., Anhui (CN); BOE Technology Group Co., Ltd., Beijing (CN)

( * ) Notice: Subject to any disclaimer, the term of this patent is extended or adjusted under 35 U.S.C. 154(b) by 753 days.

(21) Appl. No.: 17/289,242

(22) PCT Filed: Aug. 20, 2020

(86) PCT No.: PCT/CN2020/110172
§ 371 (c)(1),
(2) Date: Apr. 28, 2021

(87) PCT Pub. No.: WO2021/032149
PCT Pub. Date: Feb. 25, 2021

(65) Prior Publication Data
US 2021/0399067 A1 Dec. 23, 2021

(30) Foreign Application Priority Data
Aug. 21, 2019 (CN) .......................... 201910774317.3

(51) Int. Cl.
*H10K 71/13* (2023.01)
*H10K 59/122* (2023.01)
*H10K 71/00* (2023.01)

(52) U.S. Cl.
CPC ........... *H10K 59/122* (2023.02); *H10K 71/00* (2023.02); *H10K 71/135* (2023.02)

(58) Field of Classification Search
CPC ...... H10K 71/00; H10K 71/13; H10K 71/135; H10K 59/122; H10K 59/173; H01L 27/12;
(Continued)

(56) References Cited

U.S. PATENT DOCUMENTS

| 7,219,978 B2 | 5/2007 | Frost et al. |
| 2020/0044169 A1* | 2/2020 | Zhao ...................... H10K 77/10 |

(Continued)

FOREIGN PATENT DOCUMENTS

| CN | 107393939 A | 11/2017 |
| CN | 107819017 A | 3/2018 |

(Continued)

OTHER PUBLICATIONS

International Search Report for PCT/CN2020/110172 Mailed Nov. 25, 2020.
(Continued)

*Primary Examiner* — Chuong A Luu
(74) *Attorney, Agent, or Firm* — Ling Wu; Stephen Yang; Ling and Yang Intellectual Property

(57) ABSTRACT

A display substrate and a manufacturing method thereof, a display device, and an inkjet printing method. The display substrate comprises a base substrate. A pixel definition layer is provided at the base substrate. The pixel definition layer is provided with a pixel area for accommodating print drops. A stepped hole having a step shape is formed in the pixel area. The stepped hole comprises at least two steps. A barrier wall is provided inside the stepped hole to separate the adjacent steps.

19 Claims, 4 Drawing Sheets

(58) Field of Classification Search
CPC ... H01L 27/1214; H01L 27/1296; G02F 1/13;
B32B 2457/202
USPC .......................................................... 257/40
See application file for complete search history.

(56) References Cited

U.S. PATENT DOCUMENTS

2020/0161391 A1\* 5/2020 Zhang .................. H10K 71/135
2020/0303686 A1\* 9/2020 Zhao .................... H10K 59/121

FOREIGN PATENT DOCUMENTS

| CN | 108922912 A | 11/2018 |
| CN | 109119550 A | 1/2019 |
| CN | 110459690 A | 11/2019 |
| JP | 2013-089293 A | 5/2013 |
| KR | 10-2010-0054351 A | 5/2010 |

OTHER PUBLICATIONS

Office Action dated Jan. 28, 2021 for Chinese Patent Application No. 201910774317.3 and English Translation.
Office Action dated Jul. 13, 2021 for Chinese Patent Application No. 201910774317.3 and English Translation.

\* cited by examiner

DISPLAY SUBSTRATE AND MANUFACTURING METHOD THEREOF, DISPLAY DEVICE, AND INKJET PRINTING METHOD

The present application claims the priority of Chinese Patent Application No. CN201910774317.3, filed with the CNIPA on Aug. 21, 2019 and entitled "Display Substrate and Manufacturing Method Thereof, Display Device, and Inkjet Printing Method", the content of which should be regarded as being incorporated into this application by reference.

TECHNICAL FIELD

Embodiments of the present disclosure relate to, but are not limited to, the field of display technology, and particularly relate to a display substrate and a method for manufacturing the display substrate, a display apparatus, and an inkjet printing method.

BACKGROUND

An Organic Light-Emitting Diode (OLED) has advantages of self-luminescence, fast response, wide viewing angle, high brightness, bright color, being light and thin, etc., compared with a Liquid Crystal Display (LCD), and is considered as a next generation display technology.

Film formation approaches of an OLED mainly include a vapor deposition process and a solution process. The vapor deposition process is relatively mature in small-size applications, and at present it has been applied in mass production. The OLED film formation approach of solution process mainly includes inkjet printing, nozzle coating, spin coating, screen printing, etc. Among them, the inkjet printing technology is considered as an important way to realize mass production of large-size OLEDs due to its high material utilization and a capability of large-size implementation.

SUMMARY

The following is a summary of subject matter described in detail herein. This summary is not intended to limit the protection scope of the claims.

A display substrate, including a base substrate, a pixel definition layer is provided on the base substrate, the pixel definition layer is provided with a pixel area for accommodating printing droplets, a stepped hole having a step shape is formed in the pixel area, the stepped hole includes at least two layers of steps and is provided with a barrier wall for separating adjacent steps.

In an exemplary embodiment, a pixel electrode layer is arranged on each layer of step in the stepped hole, and the barrier wall is arranged on the pixel electrode layer.

In an exemplary embodiment, a planarization layer is arranged on the base substrate, the pixel definition layer is arranged on the planarization layer, and the stepped hole is formed in the planarization layer.

In an exemplary embodiment, a material of the barrier wall is a hydrophobic material.

In an exemplary embodiment, the material of the barrier wall is at least one of polymethyl methacrylate, fluorinated polymethyl methacrylate, polyimide and fluorinated polyimide.

In an exemplary embodiment, a height of the barrier wall is 0.05 um to 0.23 um.

In an exemplary embodiment, a section of the barrier wall has a trapezoidal shape.

In an exemplary embodiment, the pixel area has a rectangular shape.

In an exemplary embodiment, the stepped hole includes one first step and two second steps, the first step is located in the middle of the pixel area and between the two second steps, and a distance between the second steps and the base substrate is greater than a distance between the first step and the base substrate.

In an exemplary embodiment, the barrier wall is arranged at an edge of a second step close to the first step, and crosses the pixel area in a direction of a short side of the pixel area.

In an exemplary embodiment, the pixel electrode layer is arranged on the stepped hole, the pixel electrode layer covers the whole stepped hole, and the pixel electrode layer is connected with the base substrate through the stepped hole.

In an exemplary embodiment, the barrier wall separating the adjacent steps in the stepped hole is arranged on the pixel electrode layer.

An embodiment of the present disclosure further provides a display apparatus, including the display substrate described above.

An embodiment of the present disclosure further provides a method for manufacturing a display substrate, including:
  forming a stepped hole having at least two layers arranged in a stepped manner on a base substrate;
  forming a pixel definition layer on the base substrate, wherein the pixel definition layer is arranged around the stepped hole; and
  forming a barrier wall in the stepped hole, wherein the barrier wall separates adjacent steps of the stepped hole.

In an exemplary embodiment, after forming the barrier wall in the stepped hole, the method further includes:
  dropping printing droplets into the stepped hole, wherein at least two of the printing droplets are arranged in a first direction, two opposite edges of each step of the stepped hole in the first direction are first edges, a printing droplet closest to a first edge in the first direction is a first printing droplet, and a diameter of the first printing droplet is larger than diameters of the other printing droplets.

An embodiment of the present disclosure further provides an inkjet printing method, including:
  forming a pixel definition layer on a base substrate, wherein a pixel area for accommodating printing droplets is formed in the pixel definition layer; and
  dropping printing droplets into the pixel area, wherein at least two of the printing droplets are arranged in a first direction, two opposite edges of the pixel area in the first direction are first edges, a printing droplet closest to a first edge in the first direction is a first printing droplet, and a diameter of the first printing droplet is larger than diameters of the other printing droplets.

Other aspects will become apparent upon reading and understanding accompanying drawings and the detailed description.

BRIEF DESCRIPTION OF DRAWINGS

The accompanying drawings are used to provide a further understanding of the technical solutions of the present disclosure and form a part of the specification. Together with the embodiments of the present disclosure, they are used to explain the technical solution of the present disclosure and do not constitute a limitation on the technical solution of the present disclosure. Shapes and dimensions of the components in the accompanying drawings do not reflect real proportions, and are only for the purpose of schematically illustrating the contents of the present disclosure.

DESCRIPTION OF REFERENCE SIGNS

Figure 1:
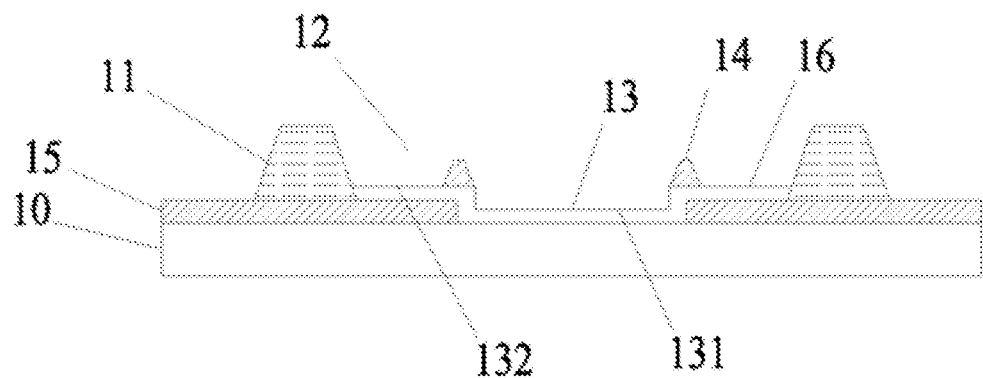
FIG. 1 is a sectional view of a display substrate according to an embodiment of the present disclosure.

| 10-base substrate; | 11-pixel definition layer; | 12-pixel area; |
| --- | --- | --- |
| 13-stepped hole; | 14-barrier wall; | 15-planarization layer; |
| 16-pixel electrode layer; | 17-printing device; | 18-printing droplet; |
| 19-first edge; | 131-first step; | 132-second step; |
| 171-first nozzle; | 172-second nozzle; | 173-third nozzle; |
| 174-fourth nozzle; | 175-fifth nozzle; | 176-sixth nozzle; |
| 181-first droplet; | 182-second droplet; | 183-third droplet; |
| 184-fourth droplet; | 185-fifth droplet; | 186-sixth droplet. |

DETAILED DESCRIPTION

The embodiments herein may be implemented in a number of different forms. A person of ordinary skills in the art will readily understand the fact that implementations and contents may be transformed into a variety of forms without departing from the spirit and scope of the present disclosure. Therefore, the present disclosure should not be construed as being limited only to what is described in the following embodiments. The embodiments in the present disclosure and the features in the embodiments may be combined with each other randomly if there is no conflict.

At present, in order to form an organic functional layer in an organic light-emitting diode by using inkjet printing technology, it is required to manufacture a pixel definition layer on an underlay substrate in advance, pixel areas are formed in the pixel definition layer, and printing droplets are ejected into a designated pixel area. However, in the prior art, volume fraction of the pixel area is relatively low, and printing droplets will flow during a drying process, resulting in non-uniform film formation, which has a great impact on service life and display effect of a display device.

In a technique of forming an organic light-emitting diode by using the inkjet printing technology, for the organic functional layer of the organic light-emitting diode, it is required that a pixel definition layer is manufactured on an underlay substrate in advance, pixel areas, for example, including red (R), green (G) and blue (B) pixel areas, are formed in the pixel definition layer, and the pixel definition layer is used for defining printing droplets so that they can accurately flow into a designated R/G/B pixel area. However, the volume fraction of the pixel areas is relatively low, and the volume of printing droplets that can be allowed by internal volume of the pixel area is smaller than the volume of the device's film thickness, so that the printing droplets fully fill the pixel pits during the printing process. In the printing process, since a center of a printing droplet is located at a center of a long side of the pixel area and each droplet of the current nozzle normally ranges from 4 picoliters to 10 picoliters, several droplets need to be injected into each pixel area with different nozzles or the same nozzle. In order to ensure that the printing droplets can accurately enter the pixel area without falling outside the designated pixel area, a keep out distance) must be ensured for the printing droplets entering the pixel area. At the same time, in order to fully spread the printing droplets, different printing droplets must be landed onto different places. If the printing droplets are landed at the same position, overflowing is very likely to occur, and then in the practical technological process, it will be found that insufficient wetting (dewetting) occurs to the printing droplets at the four corners of the pixel area, leading to dark spots or darkening in the end, which affects the uniformity and quality of the panel. In addition, the printing droplets will flow during the drying process, resulting in non-uniform film formation, which has a great impact on the service life and the display effect of the display device.

An embodiment of the present disclosure provides a display substrate, including a base substrate, a pixel definition layer is provided on the base substrate, wherein the pixel definition layer is provided with a pixel area for accommodating printing droplets, a stepped hole having a step shape is formed in the pixel area, the stepped hole includes at least two layers of steps, and a barrier wall is arranged in the stepped hole, and the barrier wall is used for separating adjacent steps (i.e., steps of adjacent layers) in the stepped hole.

According to the display substrate provided by an embodiment of the present disclosure, by forming a stepped hole in the pixel area, the volume fraction of the pixel area for accommodating printing droplets is improved without increasing the height of the pixel definition layer, thus the effective display area of the pixel area is increased; and by arranging a barrier wall in the stepped hole to separate adjacent steps in the stepped hole, printing droplets on adjacent steps are prevented from flowing to each other, thereby avoiding the non-uniform film formation in the pixel area.

Figure 2:
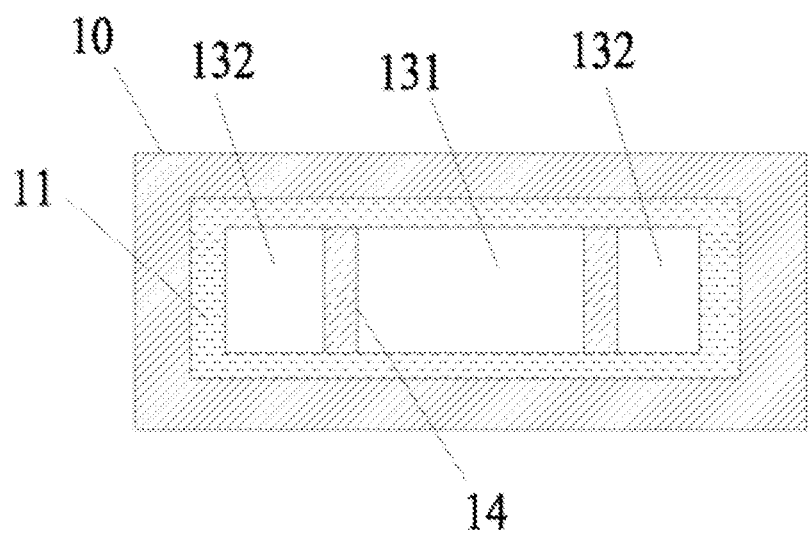
FIG. 2 is a top view of a display substrate according to an embodiment of the present disclosure.

Taking a case where the stepped hole includes two layers of steps as an example, FIG. 1 is a sectional view of a display substrate according to an embodiment of the present disclosure, and FIG. 2 is a top view of a display substrate according to an embodiment of the present disclosure. As shown in FIG. 1 and FIG. 2, the display substrate according to an embodiment of the present disclosure includes a base substrate 10, a pixel definition layer 11 is provided on the base substrate 10, the pixel definition layer 11 is provided with a pixel area 12 for accommodating printing droplets, and a stepped hole 13 having two layers arranged in a stepped manner is formed in the pixel area 12, and a barrier wall 14 for separating adjacent steps of the stepped hole 13 is provided in the stepped hole 13.

According to the display substrate provided by the embodiment of the present disclosure, by forming the stepped hole in the pixel area, the volume fraction of the pixel area accommodating printing droplets is improved without increasing the height of the pixel definition layer, and the effective display area of the pixel area is increased; and by arranging the barrier wall in the stepped hole to separate adjacent steps in the stepped hole, printing droplets on adjacent steps are prevented from flowing to each other, thereby avoiding non-uniform film formation in the pixel area.

As shown in FIG. 1 and FIG. 2, the pixel definition layer 11 may be rectangular, and the pixel definition layer 11 may be provided with a rectangular pixel area 12 (also called an opening area). The stepped hole 13 in the pixel area 12 includes a first step 131 and a second step 132. The first step 131 may be located in the middle of the pixel area 12, and height of the second step 132 is larger than that of the first step 131, i.e., a distance between the second step 132 and the base substrate 10 is greater than a distance between the first step 131 and the base substrate 10. In one pixel area 12, there may be a plurality of second steps 132. For example, when there are two second steps 132, the second steps 132 and the first step 131 are arranged alternatively, that is, one first step 131 is located between the two second steps 132 and the two second steps 132 are located on two sides of the first step 131. The barrier wall 14 is arranged at an edge of a second step 132 close to the first step 131, and crosses the pixel area 12 in direction of a short side of the pixel area 12, thus separating the second step 132 from the first step 131, so as to prevent the printing droplets on the second step 132 from flowing to the first step 131 and prevent solute of the printing droplets from accumulating at the first step 131 which causes the resultant film layer formed after drying to have a relatively thicker center and relatively thinner edge, i.e., the resultant film layer is relatively thicker at the first step 131 and relatively thinner at the second step 132.

In an exemplary embodiment, a stepped hole having two or more layers arranged in a stepped manner may also be formed in the pixel area, and adjacent steps are separated by a barrier wall, which will not be described further here.

As shown in FIG. 1, a planarization layer 15 is arranged on the base substrate 10, and the planarization layer 15 is provided with a via hole communicating with the base substrate 10 to form a hole 13 with two layers of steps. The pixel definition layer 11 is arranged on the planarization layer 15, and the pixel definition layer 11 is disposed around the stepped hole 13. In this example, the first step in the stepped hole 13 is an area exposed by the via hole, and the second step is an upper surface (the surface away from the base substrate) of the planarization layer in the opening of the pixel area.

As shown in FIG. 1, a pixel electrode layer 16 is provided in the stepped hole 13. The pixel electrode layer 16 covers the whole stepped hole 13, i.e., covering the plane of the first step and the plane of the second step, and the pixel electrode layer 16 is connected with the base substrate 10 through the stepped hole 13. The barrier wall 14 separating the steps in adjacent layers of the stepped hole 13 is arranged on the pixel electrode layer 16, so as to prevent the printing droplets on the pixel electrode layer 16 from communicating to cause the resultant film on the pixel electrode layer 16 to have uneven thickness, which affects the display effect of the display device.

In an exemplary embodiment, material of the barrier wall may be a hydrophobic material, so as to ensure that the barrier wall can separate the printing droplets. The material of the barrier wall may be a hydrophobic organic material, e.g., at least one of polymethyl methacrylate, fluorinated polymethyl methacrylate, polyimide and fluorinated polyimide.

In an exemplary embodiment, a height of the barrier wall is 0.05 um (micron) to 0.23 um, which on the one hand can suppress a climbing height of the printing droplets, and on the other hand can block the printing droplets on adjacent steps from flowing to each other.

In an exemplary embodiment, the section of the barrier wall is trapezoidal (with respect to a plane perpendicular to the base substrate and parallel to a first direction, with the first direction being an extension direction of a long side of the rectangular pixel area), which on the one hand can suppress the climbing height of the printing droplets, and on the other hand can maintain the loading capacity of printing droplets.

To sum up, in the display substrate of the present embodiment, the volume fraction of the pixel area is improved, and the effective display area of the pixel area is increased, and at the same time, uniform film formation of the pixel area is ensured.

An embodiment of the present disclosure provides a method for manufacturing a display substrate to manufacture the display substrate of the previous embodiments.

The method for manufacturing a display substrate according to an embodiment of the present application includes the following 1) to 3):

In 1), a stepped hole is formed on a base substrate. Forming a stepped hole on a base substrate includes: forming a planarization layer on the base substrate, and forming a via hole on the planarization layer by a patterning process, wherein the via hole enables a stepped hole having two layers arranged in a stepped manner to be formed in the planarization layer.

The stepped hole may include one first step and two second steps, wherein the first step is located in the middle of the pixel area, a distance between the second steps and the base substrate is greater than a distance between the first step and the base substrate, and the second steps are located on two sides of the first step.

In an exemplary embodiment, a transparent conductive thin film may be deposited on the planarization layer, and the transparent conductive thin film is patterned by a patterning process to form a pixel electrode layer 16. The transparent conductive thin film may be made of indium tin oxide (ITO) or indium zinc oxide (IZO).

In 2), a pixel definition layer is formed on the planarization layer of the base substrate, wherein the pixel definition layer is arranged around the stepped hole.

In 3), a barrier wall is formed on the stepped hole, wherein the barrier wall is arranged at an edge a second step close to the first step, and crosses the pixel area in direction of a short side of the pixel area, thus separating the second step from the first step.

The "patterning process" mentioned in the present disclosure includes processing, such as film layer deposition, photoresist coating, mask exposure, development, etching, and photoresist stripping. The deposition may be selected as sputtering, vapor deposition, chemical vapor deposition and other processes, which are not limited here. In the description of the present disclosure, a "thin film" refers to a layer of thin film formed from a certain material on a substrate through a depositing or coating process. If a patterning process or a photolithography process is not needed for the "thin film" during the whole manufacturing process, the "thin film" may also be referred to as a "layer". If a patterning process or a photolithography process is needed for the "thin film" during the whole manufacturing process, it is referred to as a "thin film" before the patterning process and referred to as a "layer" after the patterning process. The "layer" after the patterning process or the photolithography process contains at least one "pattern".

In the display substrate manufactured by the method for manufacturing a display substrate in this embodiment, the volume fraction of the pixel area is improved, and the effective display area of the pixel area is increased, and at the same time, uniform film formation of the pixel area is ensured.

After forming the barrier wall on the stepped hole, the method for manufacturing a display substrate according to an embodiment of the present application further includes:

dropping printing droplets into the stepped hole, wherein at least two drops of the printing droplets are arranged in a first direction. In this example, the first direction is an extension direction of a long side of the rectangular pixel area, two opposite edges of each step of the stepped hole in the first direction are first edges, the first step includes two first edges, each second step includes two first edges, the two first edges of the second step are two opposite edges of the pixel area in the first direction, i.e., edges where short sides of the rectangular pixel area are located, a printing droplet closest to a first edge in the first direction is a first printing droplet, and a diameter of the first printing droplet is larger than diameters of the other printing droplets.

Figure 3:
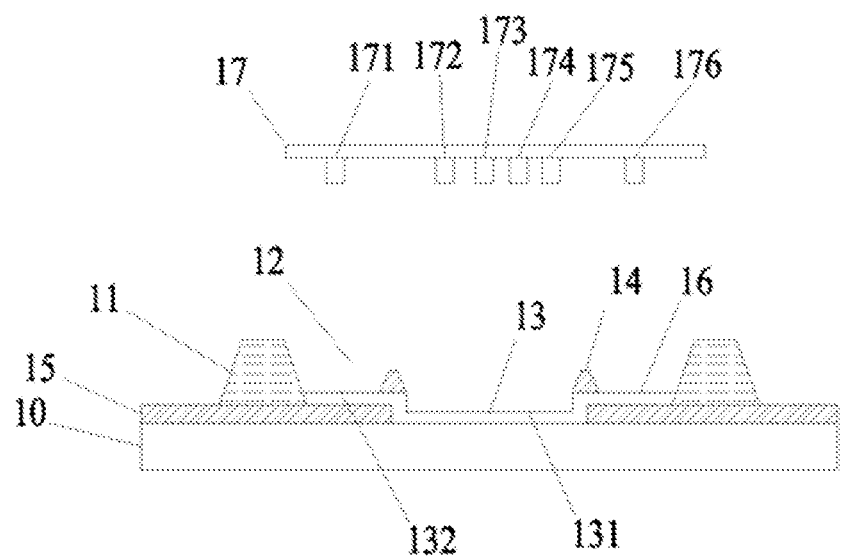
FIG. 3 is a schematic structural view of a display substrate when printing droplets are dropped into a pixel area by a printing device according to an embodiment of the present disclosure.
Figure 4:
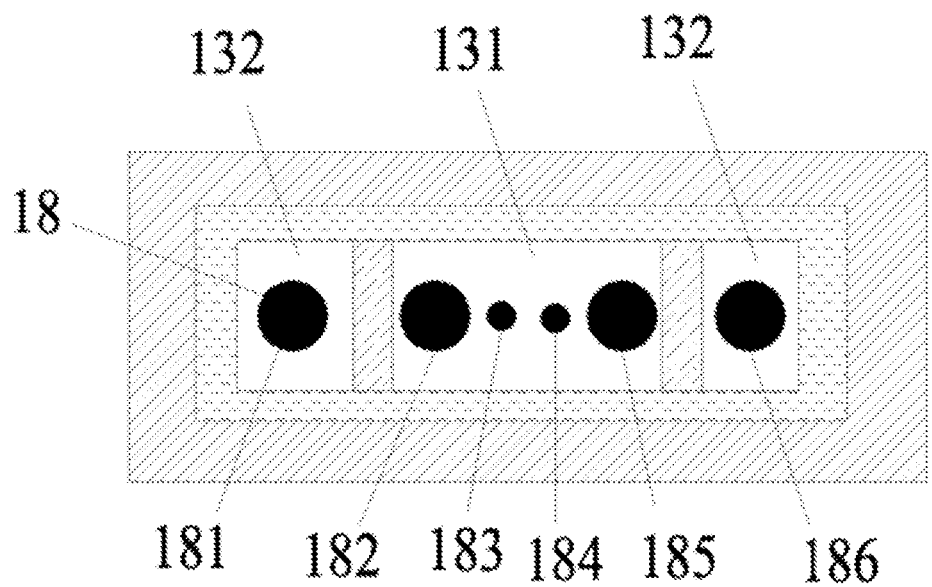
FIG. 4 is a schematic structural view of a display substrate after printing droplets are dropped into a pixel area according to an embodiment of the present disclosure.

FIG. 3 is a schematic structural view of a display substrate when printing droplets are dropped into a pixel area by a printing device according to an embodiment of the present disclosure, and FIG. 4 is a schematic structural view of a display substrate after printing droplets are dropped into a pixel area according to an embodiment of the present disclosure. Detailed description will be given below by taking the display substrate shown in FIG. 3 and FIG. 4 as an example.

As shown in FIG. 3 and FIG. 4, printing droplets 18 are dropped into the pixel area 12 of the display substrate by a printing device 17. The printing device 17 includes a first nozzle 171, a second nozzle 172, a third nozzle 173, a fourth nozzle 174, a fifth nozzle 175 and a sixth nozzle 176. Center points of the first nozzle 171, the second nozzle 172, the third nozzle 173, the fourth nozzle 174, the fifth nozzle 175 and the sixth nozzle 176 are all located on a same reference straight line, and they are arranged in the first direction of the pixel area 12. The first nozzle 171 and the sixth nozzle 176 correspond to the second steps 132 located on the two sides of the pixel area 12 respectively, and the second nozzle 172, the third nozzle 173, the fourth nozzle 174 and the fifth nozzle 175 correspond to the first step 131 located in the middle of the pixel area 12. The first nozzle 171, the second nozzle 172, the fifth nozzle 175 and the sixth nozzle 176 have a larger ejection amount than the third nozzle 173 and the fourth nozzle 174.

In the embodiment shown in FIG. 3 and FIG. 4, after the first nozzle 171, the second nozzle 172, the third nozzle 173, the fourth nozzle 174, the fifth nozzle 175 and the sixth nozzle 176 drop printing droplets 18 into the pixel area 12 of the display substrate, a first droplet 181, a second droplet 182, a third droplet 183, a fourth droplet 184, a fifth droplet 185 and a sixth droplet 186 are formed sequentially in the pixel area 12. The first droplet 181 and the sixth droplet 186 are the printing droplets closest to the two edges of the second steps 132, that is, the first droplet 181 and the sixth droplet 186 are both the aforementioned first printing droplets, wherein the first droplet 181 is closest to the first edge of the second step 132 (the second step 132 on the left side in FIG. 4) corresponding to the first droplet 181, and the sixth droplet 186 is closest to the first edge of the second step 132 (the second step 132 on the right side in FIG. 4) corresponding to the first droplet 186. An edge of the first step 131 close to a barrier wall is the first edge of the first step 131, and the second droplet 182 and the fifth droplet 185 are printing droplets closest to the two first edges of the first step 131, that is, the second droplet 182 and the fifth droplet 185 are both the aforementioned first printing droplets. The first droplet 181, the second droplet 182, the fifth droplet 185 and the sixth droplet 186 have a larger diameter than the third droplet 183 and the fourth droplet 184.

According to the method for manufacturing a display substrate in an embodiment of the present disclosure, by increasing the ejection amount of printing droplets close to each step edge of the stepped hole to enable the printing droplets close to the edges to have a relatively large volume, the printing droplets can be spread more easily to each step edge of the stepped hole, thereby reducing the risk of dewetting of the stepped hole and improving the printing quality.

To sum up, the method for manufacturing a display substrate according to an embodiment of the present disclosure improves the volume fraction of the pixel area, ensures uniform film formation in the pixel area in the inkjet printing process, reduces the risk of dewetting at the edges of the pixel area, and improves the printing quality.

Figure 5:
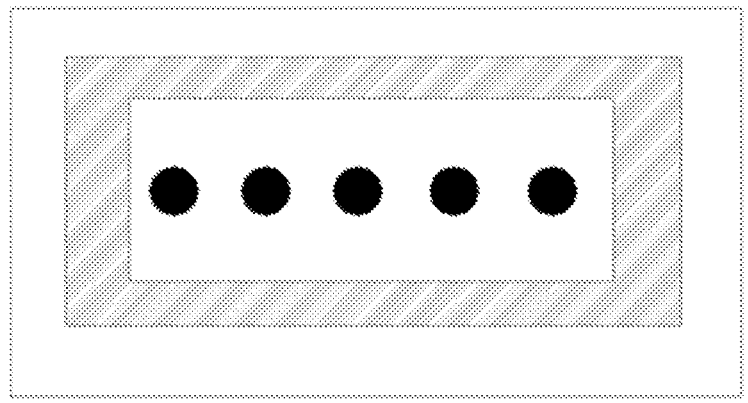
FIG. 5 is a schematic structural view after printing droplets are dropped into a pixel area in an inkjet printing method.
Figure 6:
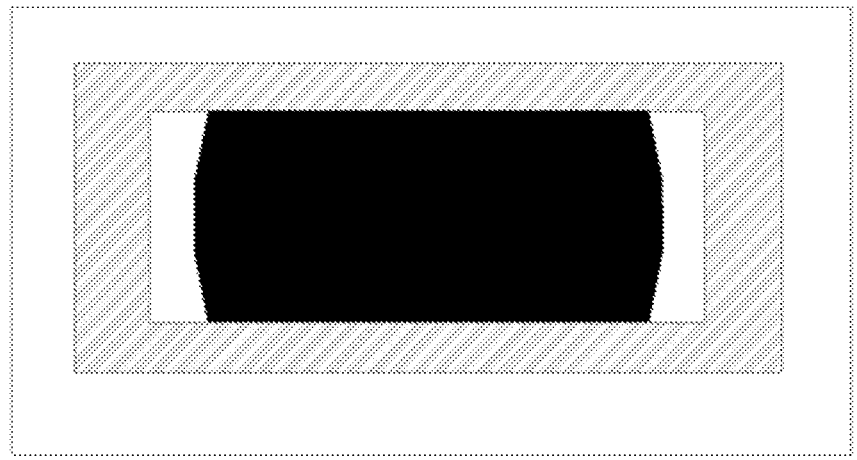
FIG. 6 is a schematic structural view after film formation in a pixel area in an inkjet printing method.

FIG. 5 is a schematic structural view after printing droplets are dropped into a pixel area in an inkjet printing method, and FIG. 6 is a schematic structural view after film formation in a pixel area in an inkjet printing method. As shown in FIG. 5 and FIG. 6, in the technological process of inkjet printing, in order to ensure that printing droplets can accurately enter the pixel area without falling outside the designated pixel area, a keep out distance must be ensured for the printing droplets entering the pixel area. At the same time, in order to fully spread the printing droplets, different printing droplets must be landed onto different places. If the printing droplets are landed at the same position, overflowing is very likely to occur; and then in the practical technological process, it will be found that dewetting occurs to the printing droplets at the four corners of the pixel area, finally leading to dark spots or darkening, which affects the uniformity and quality of the panel.

An embodiment of the present disclosure further provides an inkjet printing method, which is applicable to manufacturing various display substrates, especially the display substrate described in the first embodiment, to avoid the phenomenon of dewetting at the edges of the pixel area in the display substrate described in the first embodiment.

Figure 7:
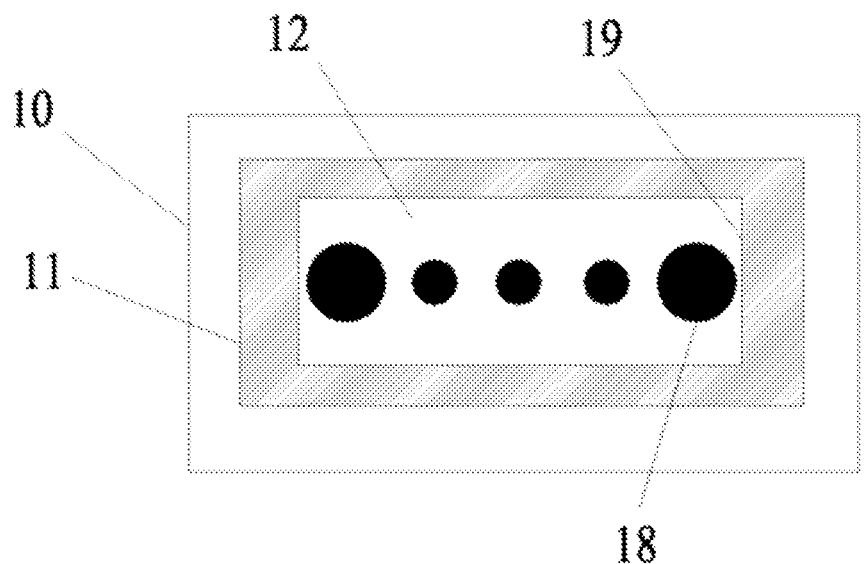
FIG. 7 is a schematic structural view after printing droplets are dropped into a pixel area in an inkjet printing method according to an embodiment of the present disclosure.
Figure 8:
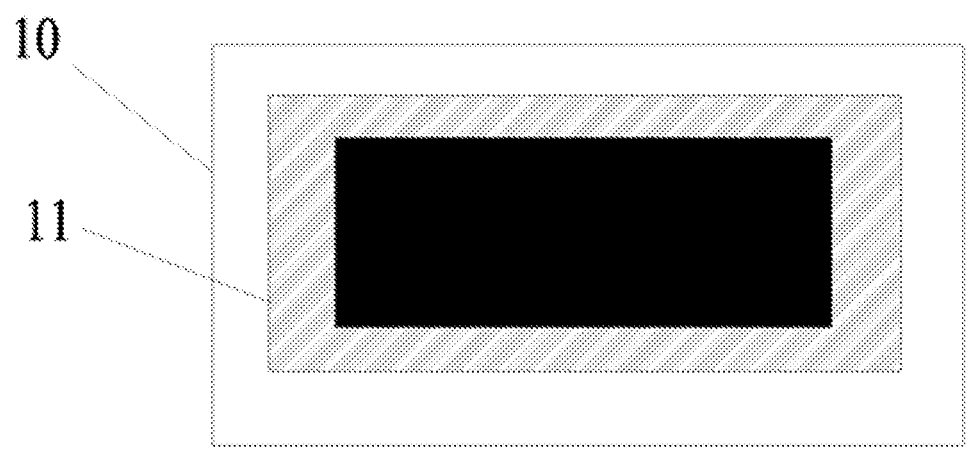
FIG. 8 is a schematic structural view after film formation in a pixel area in an inkjet printing method according to an embodiment of the present disclosure.

FIG. 7 is a schematic structural view after printing droplets are dropped into a pixel area in an inkjet printing method according to an embodiment of the present disclosure, and FIG. 8 is a schematic structural view after film formation in a pixel area in an inkjet printing method according to an embodiment of the present disclosure. As shown in FIG. 7 and FIG. 8, the inkjet printing method according to an embodiment of the present disclosure includes:

forming a pixel definition layer 11 on a base substrate 10, forming a pixel area 12 for accommodating printing droplets in the pixel definition layer 11; and dropping printing droplets 18 into the pixel area 12, wherein at least two of the printing droplets 18 are arranged in a first direction, two opposite edges of the pixel area 12 in the first direction are first edges 19, a printing droplet 18 closest to the first edge 19 in the first direction is a first printing droplet, and the diameter of the first printing droplet is larger than the diameters of the other printing droplets 18.

The inkjet printing method according to an embodiment of the present disclosure reduces the risk of dewetting at the edges of the pixel area and improves the printing quality.

An embodiment of the present disclosure further provides a display apparatus, including the display substrate described above. The display apparatus may be any product or component with a display function such as a mobile phone, a tablet computer, a television, a display, a laptop computer, a digital photo frame, a navigator, etc.

In the description of the present disclosure, it should be understood that the orientation or position relations indicated by the terms "middle", "upper", "lower", "front", "rear", "vertical", "horizontal", "top", "bottom", "inner", "outer" and the like are based on the orientation or position relations shown in the drawings, which is only for the convenience of describing the present disclosure and simplifying the description, rather than indicating or implying that the apparatus or element referred to must have the specific orientation, or be constructed and operated in the specific orientation, and thus cannot be interpreted as limitation on the present disclosure.

In the description of the present disclosure, it should be noted that, unless otherwise clearly specified or defined, the term "install", "connect" or "link" should be broadly interpreted, for example, a connection may be a fixed connection, a detachable connection, or an integral connection; it may be a mechanical connection or an electrical connection; and it may be direct connection, indirect connection through an intermediary, or an internal connection between two elements. Those of ordinary skills in the art can understand the specific meanings of the above terms in the present disclosure according to specific situations.

Although the embodiments disclosed in the present disclosure are as described above, the described contents are only the embodiments for facilitating understanding of the present disclosure, which are not intended to limit the present disclosure. Any person skilled in the art to which the present disclosure pertains may make any modifications and variations in the forms and details of implementation without departing from the spirit and the scope disclosed by the present disclosure. However, the patent protection scope of the present application shall still be subject to the scope defined by the appended claims.

What is claimed is:

1. A display substrate, comprising a base substrate, wherein a pixel definition layer is provided on the base substrate, the pixel definition layer is provided with a pixel area configured to accommodate printing droplets, a stepped hole having a step shape is formed in the pixel area, the stepped hole comprises at least two layers of steps, a barrier wall is provided in the stepped hole, and the barrier wall is configured to separate adjacent steps.

2. The display substrate according to claim 1, wherein a pixel electrode layer is arranged on each layer of step in the stepped hole, and the barrier wall is arranged on the pixel electrode layer.

3. The display substrate according to claim 1, wherein a planarization layer is arranged on the base substrate, the pixel definition layer is arranged on the planarization layer, and the stepped hole is formed in the planarization layer.

4. The display substrate according to claim 3, wherein a pixel electrode layer is arranged on each step in the stepped hole, the pixel electrode layer covers the whole stepped hole, and the pixel electrode layer is connected with the base substrate through the stepped hole.

5. The display substrate according to claim 1, wherein a material of the barrier wall is a hydrophobic material.

6. The display substrate according to claim 5, wherein the material of the barrier wall is at least one of polymethyl methacrylate, fluorinated polymethyl methacrylate, polyimide and fluorinated polyimide.

7. The display substrate according to claim 1, wherein a height of the barrier wall is 0.05 um to 0.23 um.

8. The display substrate according to claim 1, wherein a section of the barrier wall has a trapezoidal shape.

9. The display substrate according to claim 1, wherein the pixel area has a rectangular shape.

10. The display substrate according to claim 9, wherein the stepped hole comprises one first step and two second steps, the first step is located in middle of the pixel area and between the two second steps, and a distance between the second steps and the base substrate is greater than a distance between the first step and the base substrate.

11. The display substrate according to claim 10, wherein the barrier wall is arranged at an edge of a second step close to the first step, and crosses the pixel area in a direction of a short side of the pixel area.

12. The display substrate according to claim 1, wherein the stepped hole comprises one first step and two second steps, the first step is located in middle of the pixel area and between the two second steps, and a distance between the second steps and the base substrate is greater than a distance between the first step and the base substrate.

13. The display substrate according to claim 12, wherein the barrier wall is arranged at an edge of a second step close to the first step, and crosses the pixel area in a direction of a short side of the pixel area.

14. The display substrate according to claim 1, wherein a pixel electrode layer is arranged on each step in the stepped hole, the pixel electrode layer covers the whole stepped hole, and the pixel electrode layer is connected with the base substrate through the stepped hole.

15. The display substrate according to claim 14, wherein the barrier wall is arranged on the pixel electrode layer.

16. The display substrate according to claim 14, wherein the barrier wall is arranged on the pixel electrode layer.

17. A display apparatus, comprising the display substrate according to claim 1.

18. A method for manufacturing the display substrate according to claim 1, comprising:
    forming the stepped hole having at least two layers arranged in a stepped manner on the base substrate;
    forming the pixel definition layer on the base substrate, wherein the pixel definition layer is arranged around the stepped hole; and
    forming the barrier wall in the stepped hole, wherein the barrier wall separates adjacent steps in the stepped hole.

19. The method for manufacturing a display substrate according to claim 18, wherein after forming the barrier wall in the stepped hole, the method further comprises:
    dropping printing droplets into the stepped hole, wherein at least two of the printing droplets are arranged in a first direction, two opposite edges of each step of the stepped hole in the first direction are first edges, a printing droplet closest to a first edge in the first direction is a first printing droplet, and a diameter of the first printing droplet is larger than diameters of the other printing droplets.

* * * * *